United States Patent [19]

Meineke

[11] Patent Number: 4,830,530

[45] Date of Patent: May 16, 1989

[54] HOLD-DOWN DEVICE

[75] Inventor: William S. Meineke, Wilmington, Calif.

[73] Assignee: Rexnord Inc., Brookfield, Wis.

[21] Appl. No.: 146,920

[22] Filed: Jan. 22, 1988

[51] Int. Cl.⁴ .................... F16B 1/00; F16B 31/02
[52] U.S. Cl. .................................. 403/12; 403/105; 292/256.75
[58] Field of Search .................... 361/415, 399; 403/405.1, 11, 12, 105; 74/89.15; 292/256.75, 114, 109; 410/77, 82

[56] References Cited

U.S. PATENT DOCUMENTS

| | | | |
|---|---|---|---|
| 3,212,746 | 10/1965 | Wright | 248/361 |
| 3,640,141 | 2/1972 | Hollingsead et al. | 74/89.15 |
| 3,796,950 | 3/1974 | Weber | 339/91 |
| 3,866,878 | 2/1975 | Yamamoto | 248/500 |
| 4,506,439 | 3/1985 | Roarke | 29/747 |
| 4,534,234 | 8/1985 | Cosenza | 74/89.15 |

Primary Examiner—Randolph A. Reese
Assistant Examiner—Carol I. Bordas

[57] ABSTRACT

A hold-down device is shown for connecting a chassis to a rack under a predetermined force and for extracting the chassis from the rack. The device includes a threaded bolt which receives a tubular, internally threaded clutch drive shaft having an integral clutch plate. A clutch drive disc slides over the shaft to engage the clutch plate, while a ratchet cam slides over the clutch drive disc. The ratchet cam has a set of ratchet teeth that engage similar teeth on the hook connector that slides over the shaft from the opposite side of the clutch plate. Belleville spring washers urge the clutch plate and clutch drive disc into engagement, while other springs urge the ratchet teeth apart. A knob fits over the springs and slides over the shaft and an extractor slides over the shaft from the opposite direction to complete the device.

14 Claims, 4 Drawing Sheets

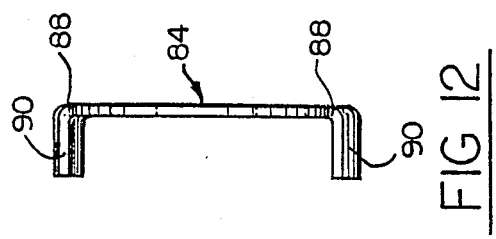
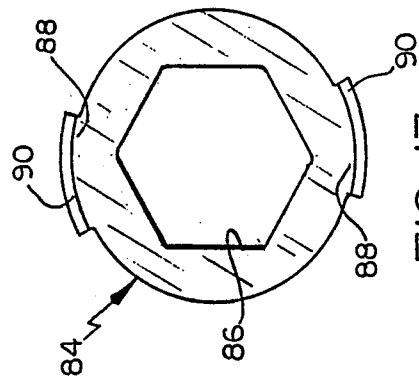
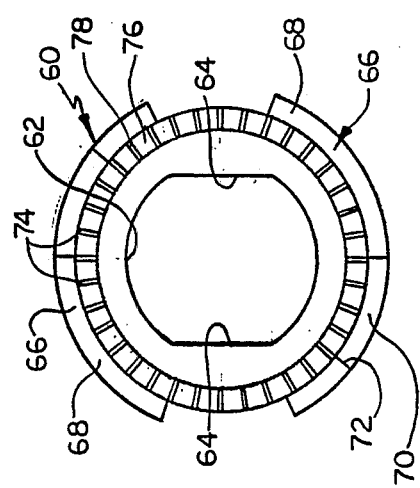
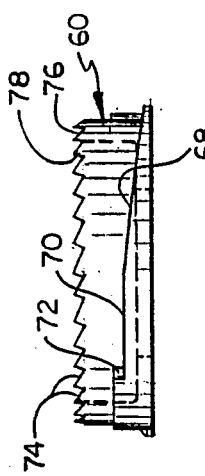
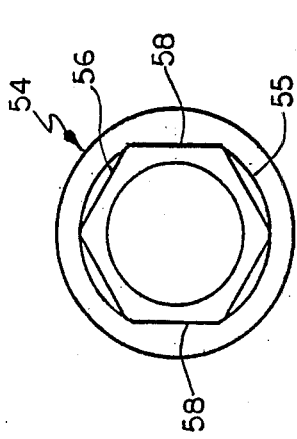
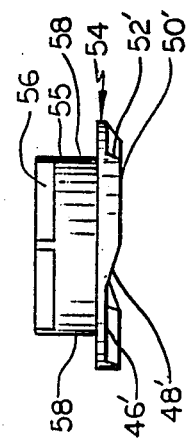
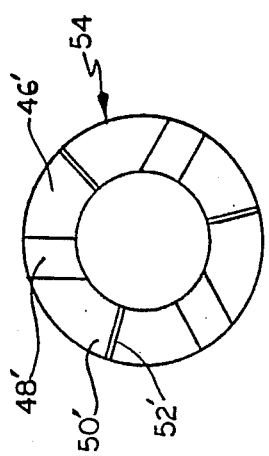

HOLD-DOWN DEVICE

BACKGROUND OF THE INVENTION

1. Field of the Invention

The present invention relates a hold-down device and, more particularly, to a hold-down device that has a force limiting feature and a positive locking and unlocking feature for inserting and extracting an electrical chassis from a rack and for placing a predetermined force upon the chassis.

2. Description of the Prior Art

The use of clamping devices to secure chassis to a rack or other support against shock and vibration is well known. The chassis may mount various kinds of equipment, such as electronic equipment, and may be mounted in a vehicle, aircraft or other environment that is subject to prolonged vibration and severe shock. The equipment for securing a chassis within a rack has been standardized in many cases. The standard chassis mount utilizes a hook mounted upon the front face of the chassis which is engaged by a clamping nut that fits over the hook. The clamping nut is mounted upon a threaded spindle that is typically pivoted upon the rack so that the nut, once engaged by the hook, places a force upon the chassis that forces the chassis into the rack and down against the rack shelf. Such a clamping assembly is shown in U.S. Pat. No. 3,212,746 which issued Oct. 19, 1965. This clamping assembly locks the clamping nut in place by moving a slide mounted on the nut, with an elongated slot therein, across the axis of the spindle so that the flat sides of the slot engage flats on the spindle to prevent rotation.

The clamping nut with its locking slide bar was replaced by later devices such as a device shown in U.S. Pat. No. 3,866,878 which issued Feb. 18, 1975, and which is assigned to Tridair Industries, predecessor of the present assignee. This device shows a unitary lock nut assembly which is keyed to the threaded spindle. Rotation of the nut brings the clamping nut into engagement with the hook on the chassis. Thereafter, further rotation causes the nut to stop but permits the camming surfaces on a drive knob and the clamping nut to slide over one another to engage ratchet teeth on the clamping nut and a follower which is keyed to a groove located in the outer periphery of the spindle. Unlocking is accomplished by rotating the drive knob in the opposite direction whereby the knob backs away from the locked nut for separating the ratchet teeth to create a free-spinning lock nut.

Another improvement is shown in U.S. Pat. No. 4,534,234 which issued Aug. 13, 1985, and which is assigned to the same assignee as the present invention. This hold-down device is provided with a slip clutch which permits the hold-down to exert a pre-determined load upon the hook attached to the chassis. Further, the hold-down device is provided with a specially designed hook connector which is not symmetrical, as in the earlier devices described above. The end of the hook connector facing the hook has a frustro-cylindrical shape which provides a ramp with a low point and a high point. At the lowest point of the ramp is located a deep slot which permits the hook connector to fit easily over the chassis hook. By rotating the hold-down device 180°, a shorter slot is brought into engagement with the hook for quickly initiating engagement therewith.

The hold-down devices described above are useful for retaining a chassis within a rack and, when tightened, for urging the chassis into its rack where a positive connection can be made between an electrical plug located on the outer, back surface of the chassis and an electrical connector mounted on the inner surface of the rack. Some of the prior art devices are provided with overload protection that prevents the hold-down device from being overly tightened which damages the chassis; see, for example, the device shown in U.S. Pat. No. 4,534,234. Other prior art devices are provided with a positive locking arrangement which prevents shock and vibration from loosening the hold-down device, as shown in U.S. Pat. No. 3,866,878. However, many of these devices require a groove or flat on the spindle thus weakening the spindle.

SUMMARY OF THE INVENTION

Accordingly, it is an object of the present invention to provide an improved hold-down device which does not weaken the spindle by requiring grooves or flats to be placed thereon.

A further object of the present invention is to provide a hold-down device with a force limiting feature as well as a positive locking and unlocking feature within a unitary structure.

These and other advantages are obtained by providing a spindle or clevis bolt which is partially threaded to receive an internally threaded clutch drive shaft having an integral clutch plate extending therefrom. A clutch drive disc fits over the clutch drive shaft for engaging the clutch plate and is retained against the clutch plate by the urging of spring means. A ratchet member slides over the clutch drive disc and is restrained from rotation with respect thereto. Ratchet teeth on the ratchet member engage similar ratchet teeth on a hook connector which also slides over the clutch drive shaft. A knob fits over the assembly and is retained upon the clutch drive shaft by suitable retaining rings. The assembly is completed by an extractor which fits over the clutch drive shaft from the opposite end and where it is retained there by a retaining ring.

BRIEF DESCRIPTION OF THE DRAWINGS

A more complete understanding of the present invention and other objects and advantages thereof will become apparent to those skilled in the art after consideration of the following specifications and drawings, wherein:

FIG. 7 is a side view of the clutch drive disc;

FIG. 8 s a top view illustrating the clutch drive disc;

FIG. 9 is a bottom view showing the clutch drive

FIG. 10 is a side view illustrating the ratchet cam;

FIG. 11 is a top view of the ratchet cam;

FIG. 12 is a side view showing the drive plate; and

FIG. 13 is a second side view of the drive plate

DESCRIPTION OF THE PREFERRED EMBODIMENT

Figure 1:
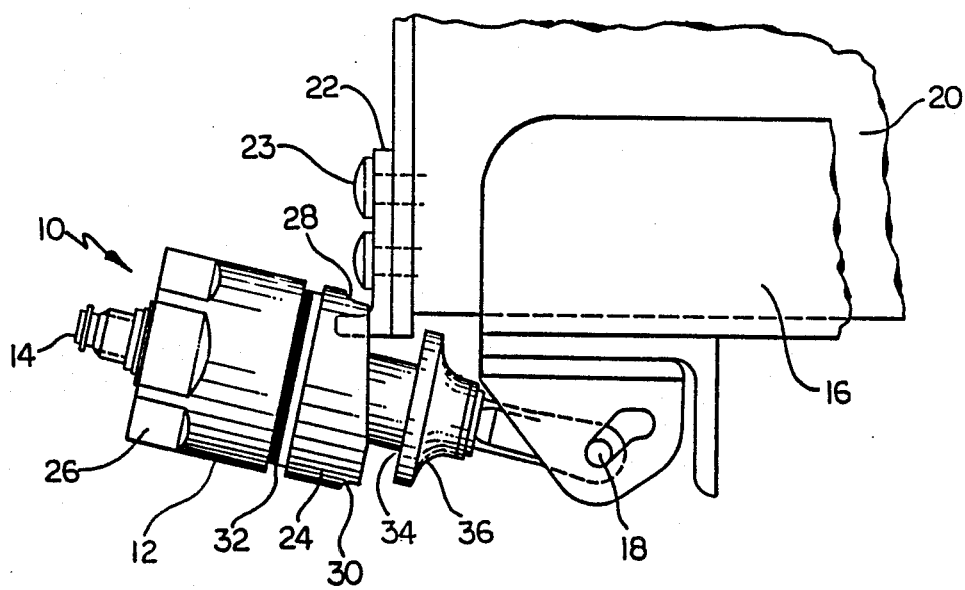
FIG. 1 is a side view showing the hold-down device in its working environment in an unlocked condition.

Referring now to the drawings, a hold-down device 10 of the present invention is shown in FIG. 1 having a knob assembly 12 attached, as by threads, to a threaded spindle or clevis bolt 14 which, in turn, is attached to a rack 16 by a pivot pin 18. Mounted within rack 16 is a chassis 20 which, for example, may house electronic equipment such as avionics equipment. The chassis 20 is generally removable from the rack 16 and is often referred to as a line replacement unit (LRU). Typically, the back surface of the chassis 20 is provided with one or more electrical plugs (not shown) that fit into electrical connectors (not shown) mounted in the rack 16. The plugs may be forced into the connectors by the hold-down device 10 to supply electrical power to the LRU chassis 20.

The chassis 20 is provided with a hook 22 which may be attached thereto by suitable fasteners 23, such as screws or rivets. The knob assembly 12 has a hook connector portion 24 and a knob portion 26, the rotation of which secures the chassis 20 to the rack 16. It will be seen in FIG. 1 that the hook connector 24 is cylindrically shaped with its hook engaging surface formed at a perpendicular or acute angle to the longitudinal axis of the hook cylinder. This angular hook engaging surface creates a cam with a short wall into which is cut a deep slot 28 which easily fits over the hook 22. The longer wall is provided with a shallow slot 30 which, when the knob 26 and hook connector 24 are rotated, engages the hook 22 for initiating the locking of the chassis 20 to the rack 16.

The hold-down device 10 is shown in its unlocked condition in FIG. 1 with a gap 32 between knob 26 and hook connector 24 about which may be placed a brightly colored band of material which indicates that the device 10 is unlocked. The hold-down device 10 is shown in its locked position in FIG. 4 with the gap 32 substantially closed. Note in FIG. 4 that a gap 34 has been created between the hook connector 24 and an extractor 36 which does not exist in FIG. 1. When it is desired to remove the chassis 20 from rack 16, the hold-down device 10 is rotated in a counter-clockwise direction, for example, until the extractor 36 engages the back of hook 22 for pulling the chassis 20 from rack 16.

Figure 2:
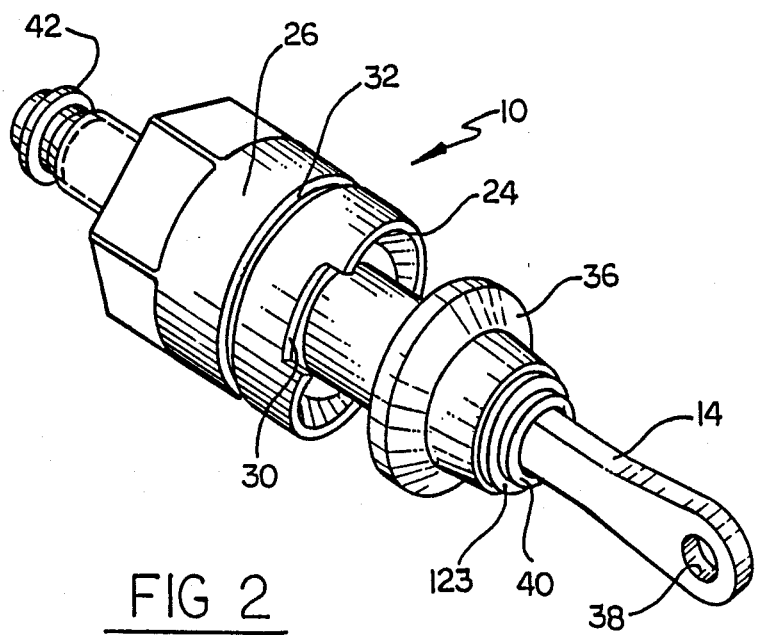
FIG. 2 is a perspective view showing the hold-down device of the present invention.
Figure 3:
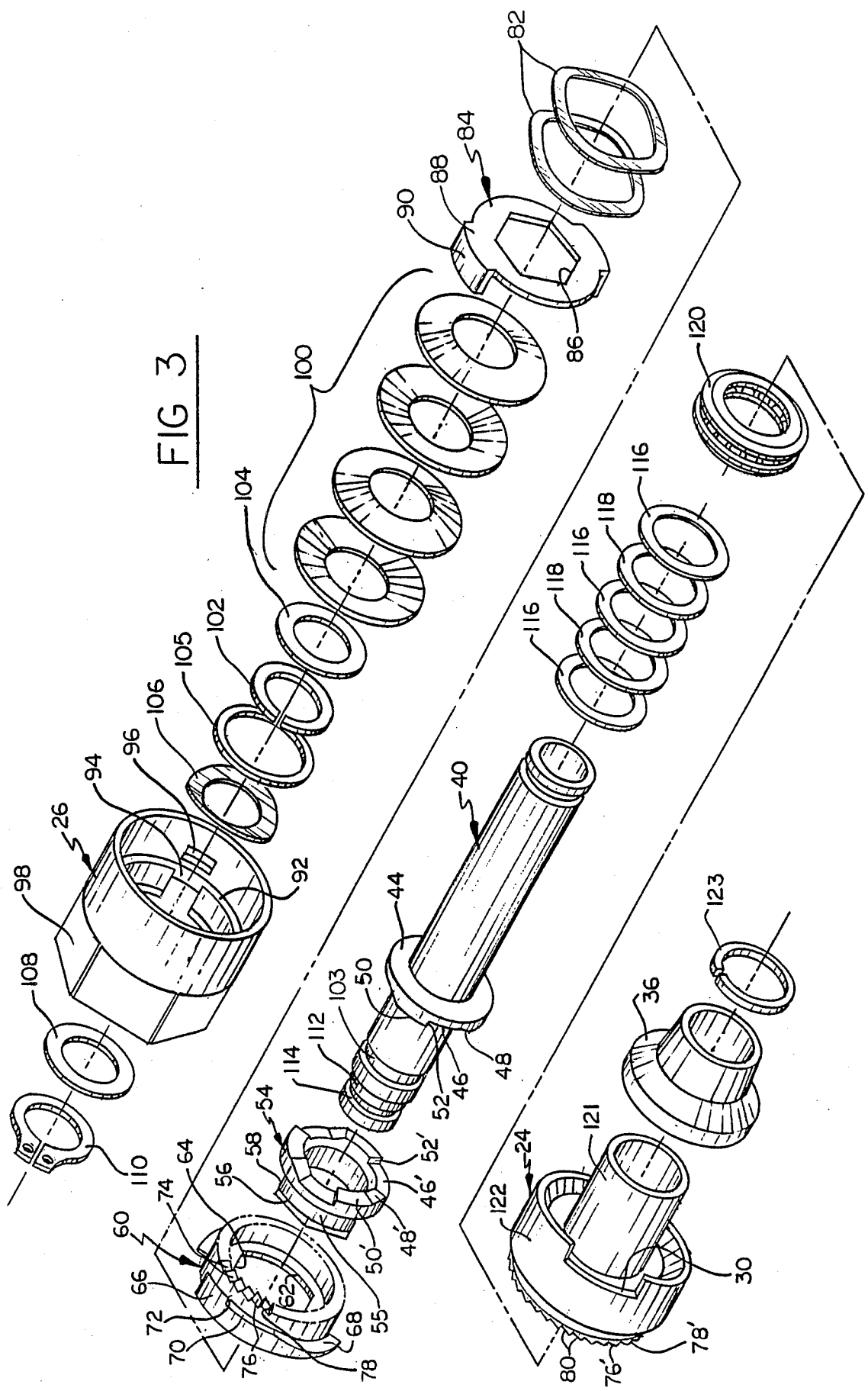
FIG. 3 is an exploded view shown in perspective illustrating the various components which make up the hold-down device.
Figure 4:
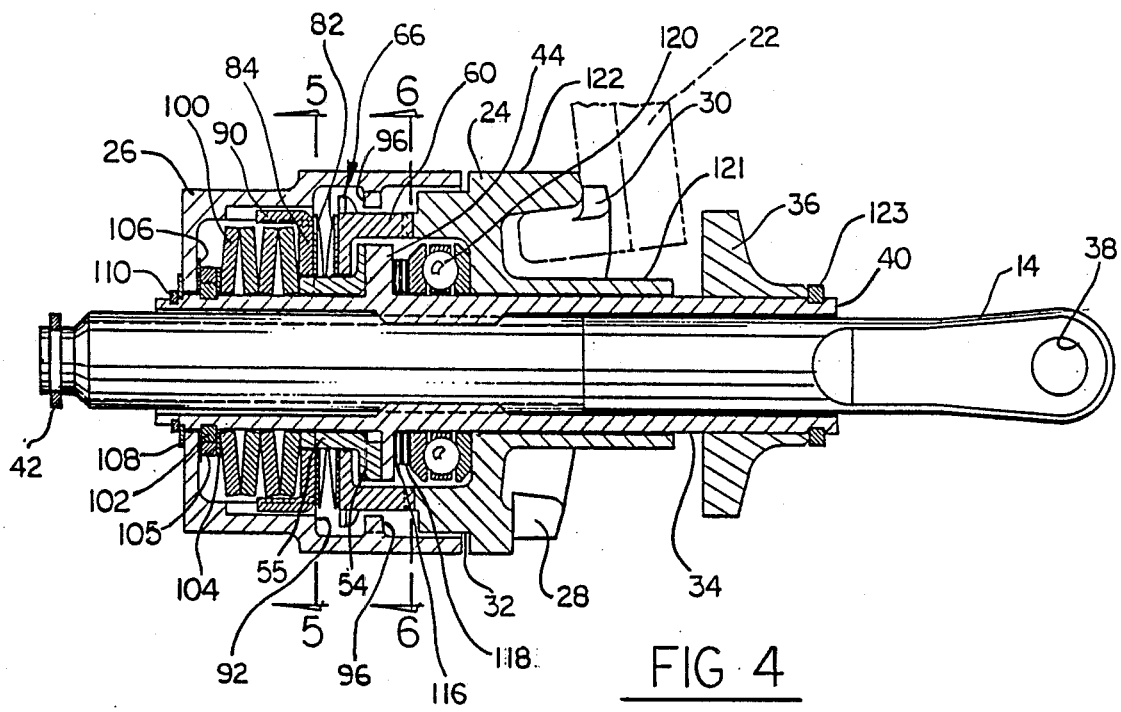
FIG. 4 is a cross-sectional view taking along the major axis of the hold-down device.

Referring now to FIGS. 2-4 the components of the hold-down device 10 are shown in greater detail. As seen in FIGS. 2 and 4, the clevis bolt 14 is provided with an aperture 38 at one end to receive the pivot pin 18 and threaded over approximately one-half of its outer diameter at the other end. A clutch drive shaft 40, FIG. 3, formed from a hollow metal tube is internally threaded to receive the external threads of bolt 14. The shaft 40 is retained upon bolt 14 by a retaining ring 42.

As seen in FIGS. 3 and 4, the external surface of the clutch drive shaft 40 is provided with a clutch plate 44 which extends as an integral, cylindrical plane perpendicularly to the longitudinal axis of shaft 40. The clutch surface of plate 44 is formed with a camming element which consists of three flat surfaces 46 parallel to the plane of the clutch plate, three surfaces 48 which are angled or ramped with respect to the flats 46, and three additional surfaces 50 that are flat and parallel to surfaces 46. The interfaces between surfaces 46 and 50 are near perpendicular to the plane of the clutch plate 44 to form three stop surfaces 52.

Next assembled upon the clutch drive shaft 40 is a clutch drive disc 54 best seen in FIGS. 7-9 which is ring-shaped having an inner diameter that slides over the outer diameter of shaft 40 with a clutch plate engaging surface substantially identical to the surface of clutch plate 44 including three flats 46', three ramps 48', three additional flats 50', and three stop surfaces 52'. A cylinder 55 extends from the opposite surface of clutch drive disc 54 whose outermost end 56 is provided with a plurality of flats, for example, a hex. One or more of the flats 58 extend up the cylindrical surface 55 to provide a sliding surface for a ratchet cam 60 shown in FIGS. 10 and 11.

The ratchet cam 60 is cylindrically shaped with an internal recess whose bottom surface has an aperture 62 with opposing flats 64. The aperture 62 receives the cylinder 55 of clutch drive disc 54 with the flats 64 of ratchet cam 60 counteracting with the flats 58 of the clutch drive disc 54 for prohibiting rotational motion between the two elements while permitting a linear, sliding motion along the major axis of the hold-down device 10. Note that the outer surface of ratchet cam 60 is provided with a pair of extending cams 66 which include a first ramped portion 68, a flat portion 70 parallel to a plane which passes perpendicularly through the longitudinal axis of the ratchet cam 60, and a stop surface 72 that is perpendicular to the flat surface 70. A plurality of ratchet teeth 74 are found on the ring-like edge of the ratchet cam 60 facing the clutch plate 44 and clutch drive disc 54. These teeth 74 are each provided with a ramped surface 76 and a stop surface 78 that is near parallel to the longitudinal axis of ratchet cam 60. The ratchet teeth 74 are arranged to interface with ratchet teeth 80 located on the outer edge of the hook connector 24 wherein the ratchet teeth have ramped surfaces 76' and stop surfaces 78, After the clutch drive disc 54 and ratchet cam 60 have been slid over each other and then over clutch drive shaft 40, FIG. 3, a pair of spring washers 82 are placed between ratchet cam 60 and a drive plate 84. Note that drive plate 84 best seen in FIGS. 12 and 13 has a hexagonally shaped aperture 86 which receives the hexagonally shaped end 56 of clutch drive disc 54. Also note that the drive plate 84 is generally cylindrical with two extending tabs 88 which support two drive plate stops 90 that are formed from sections of an outer surface of a hollow cylinder. It will be seen in Figs. 3 and 4 that the cylindrical stop tabs 90 fit within the knob 26 and further fit within the inner diameter of a shouldered section 92 therein. The shouldered section 92 of knob 26 has inwardly extending stop shoulders 94 (two are shown in the preferred embodiment of FIG. 3) which engage the stop tabs 90 to limit rotation of drive plate 84, as will be described hereinbelow. The internal structure of the knob 26 is completed by two or more additional inwardly extending cam engaging lugs 96 which fit between and engage the cam surfaces 66 of ratchet cam 60. The outer surface of knob 26 may be provided with a series of flats 98 to form a hex which may be engaged for turning by either finger pressure or a wrench, as desired.

Mounted between the drive plate 84 and knob 26 are belleville spring washers 100 (four are used in the preferred embodiment) which are engaged between the outer, end surface on the cylinder 55 of the clutch drive disc 54 and a retaining ring 102 which snaps into a groove 103 in shaft 40. As seen in FIG. 4, additional shim washers 104 may be used for spacing between the retaining ring 102 and the belleville washers 100. A retaining ring captivator 105 may also be used externally from the retaining ring 102, while a spring washer 106 mounts between the retaining ring 102 and knob 26. A flat washer 108 and a retaining ring 110 fit within grooves 112 and 114, respectively, in shaft 40 to attach the knob 26 to shaft 40.

A series of spring washers and flat washers may be mounted on the clutch drive shaft 40 against the clutch plate 44 opposite from the ramped clutch surfaces. In the preferred embodiment, this series includes three spring washers 116 and two alternating flat washers 118. Thereafter, a thrust ball bearing 120 is slid over shaft 40 before the hook connector 24 is slid over the same shaft. Hook connector 24 includes the ratchet teeth 80 which engage the ratchet teeth 74 on ratchet cam 60 against the urging of the spring washers 116. It will be seen that the hook connector includes an inner and outer, hollow concentric cylinder 121 and 122, respectively. The larger diameter, outer cylinder 122 incorporates the cam shaft discussed above and the deep and shallow slots 28 and 30; while the smaller diameter, inner cylinder 121 rides directly against shaft 40 and extends beyond the camming cylinder to engage the extractor 36 which is retained upon shaft 40 by a retaining ring 123.

Figure 6:
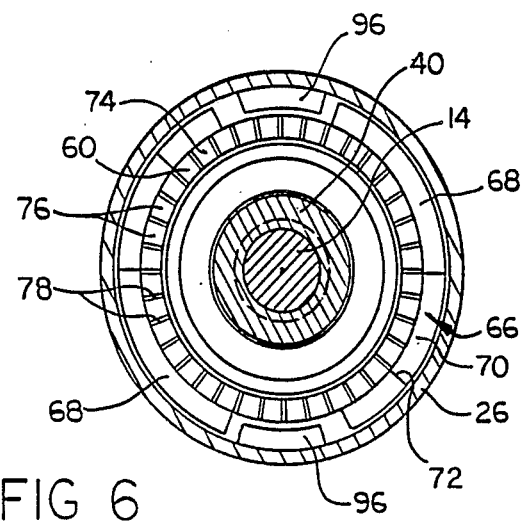
FIG. 6 is a cross-sectional view taken along lines 6—6 of FIG. 4.

Referring now to FIGS. 3, 4 and 6, the hold-down device 10 is shown in the position it assumes when closed. That is, the gap 32 has been substantially closed while the gap 34 is open. Normally, when the hold-down device is unlocked, the inner cylinder 121 of hook connector 24 is urged against extractor 36 by the combination of belleville spring washers 100, spring washers 82 and spring washers 116. In this position, there is no engagement between the ratchet teeth 74 on ratchet cam 60 and the ratchet teeth 80 on hook connector 24.

In operation, the hold-down device is positioned, as shown in FIG. 1, by turning the knob 26 and the hook connector 24 until the deep slot 28 aligns with hook 22. The hold-down device 10 is then raised for permitting the hook 22 to pass through the slot 28. The hook connector 24 is then rotated 180° until the shallow slot 30 is over and stopped against the hook 22. Continual turning of the knob 26 in the clockwise direction (if right-hand threads are used) will tighten the hook connector 24 against hook 22 until the clutch formed by clutch plate 44 and clutch drive disc 54 disengages due to the slippage of the clutch plate and disc over their ramped surfaces 48 and 48', respectively. As the knob 26 is tightened and before the clutch slips, the ratchet teeth 74 and 80 begin to engage. Further tightening which causes the clutches to disengage will limit the load between the hook connector 24 and hook 22. The point at which clutch disengagement occurs is controlled by the design of the belleville spring washers 100 which will generally place a load upon the chassis 20 along both the horizontal axis and the vertical axis.

Once tightening has ceased, the hold-down device 10 is locked in its position because the hook 22 prevents rotation of the hook connector 24. The stop surfaces 78' on the ratchet teeth 80 of hook connector 24 engage the stop surfaces 78 on ratchet teeth 74 of ratchet cam 60 to prevent rotation of the ratchet cam. As mentioned above, the flats 64 in aperture 62 of the ratchet cam 60 ride upon the flat surfaces 58 of the clutch drive disc 54 to prevent rotational movement therebetween. Next, the stop surfaces 52' on the clutch disc 54 engage the stop surfaces 52 on the clutch plate 44 to prevent the rotation of the clutch drive shaft 40. Thus, the hold-down device 10 is positively locked against rotation for retaining the chassis 20 within its rack 16.

Figure 5:
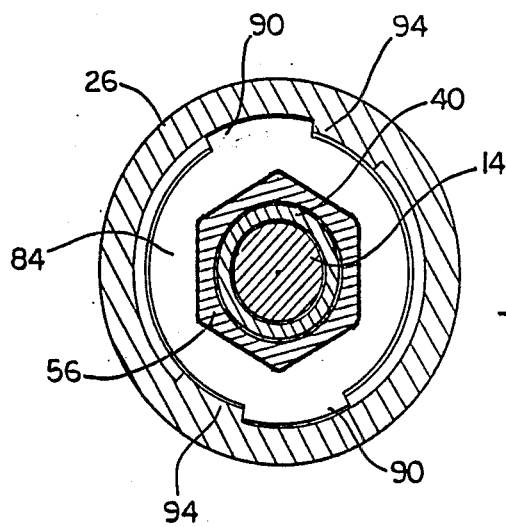
FIG. 5 is a cross-sectional view taken along lines 5—5 of FIG. 4.

Rotation of the knob 26 in a tightening direction will cause the stop shoulders 94 on the knob 26 to engage the cylindrical stop tabs 90 found upon the drive plate 84. When the knob is turned in a loosening direction, stop tabs 90 and shoulders 94 permit the knob 26 to turn freely for slightly more than 90° before the stops 90 again engage the stop shoulders 94. As seen in FIG. 6, this free turning permits the cam lugs 96 to ride over the ramped portions 68 of cams 66 until the stop tabs 90 again engage stop shoulders 94 (FIG. 5). This freedom of rotation of knob 26 while the hold-down device 10 is positively latched will cause the cam lugs 96 to lift the ratchet cam 60 for disengaging the ratchet teeth 74 thereof from the ratchet teeth 80 of the hook connector 24. Further rotation will loosen the hold-down device 10 and engage the extractor 36 with the back surface of hook 22 or the chassis for pulling the chassis 20 from its electrical connection within rack 16. Once the chassis is disconnected, the deep slot 28 is aligned with the hook 22 so that the hold-down device 10 may pivot free of the hook 22 and chassis 20.

From the foregoing description it will be seen that the present invention provides several features including a force limiting feature created by the interaction of the clutch plate 44, clutch drive disc 54 and the belleville spring washers 100. Further, the hold-down device 10 is positively locked by the interaction of the ratchet teeth between the hook connector 24 and the ratchet cam 60 as the cam 60 engages the clutch drive disc 54 and, in turn, the clutch plate 54 on shaft 40. Finally, the hold-down device may be easily unlocked by the free rotation of knob 26 which permits its cam lugs 96 to engage the cam surfaces 66 of ratchet cam 60 for disengaging the ratchet teeth.

While several modifications and variations of the present invention are possible, the present invention should be limited only by the appended claims.

I claim:

1. A hold-down device, having a clevis bolt pivotally attached to a rack, for retaining an equipment chassis within the rack with a hook attached to the chassis, comprising:
   a clutch drive shaft having a clutch plate extending therefrom threadably attached to said clevis bolt;
   a clutch drive disc engaging said clutch plate;
   means for urging said clutch drive disc against said clutch plate;
   a ratchet member slidably mounted upon said clutch drive disc having a plurality of ratchet teeth;
   a hook connector mounted upon said clutch drive shaft for engaging said hook, said hook connector having a plurality of ratchet teeth;
   means for urging said ratchet teeth of said ratchet member into engagement with said ratchet teeth of said hook connector; and
   a knob for rotating said clutch drive shaft upon said clevis bolt, rotation of which forces said hook connector into engagement with said hook, whereby said clutch plate and said clutch drive disc will slip under the urging of said first mentioned urging means to limit the engagement force between said hook and said hook connector.

2. A hold-down device, as claimed in claim 1, wherein:

said clutch plate on said clutch drive shaft and said clutch drive disc are each provided with ramp surfaces and stop surfaces which permit slippage therebetween when said knob is tightened.

3. A hold-down device, as claimed in claim 2, wherein:
said ratchet teeth of said ratchet member and said ratchet teeth of said hook connector are each provided with ramp surfaces and stop surfaces which permit slippage therebetween when said knob is tightened.

4. A hold-down device, as claimed in claim 3, wherein:
said first mention urging means establishes a preload between said hook and said hook connector to retain said chassis within said rack;
said hook prevents a loosening rotation of said hook connector;
said stop surfaces on said ratchet teeth of said hook connector and said stop surface on said ratchet teeth of said ratchet member prevent a loosening rotation of said ratchet member;
said slidable mounting between said ratchet member and said clutch drive disc prevents a loosening rotation of said clutch drive disc; and
said stop surfaces on said clutch drive disc and said stop surfaces on said clutch plate prevent a loosening rotation of said clutch drive shaft; whereby said hold-down drive becomes self locking at said limited engagement force.

5. A hold-down device, as claimed in claim 4, additionally comprising:
a drive plate mounted between said knob and said clutch drive disc, whereby rotation of said knob is translated to said drive plate, said clutch drive disc and said clutch plate on said clutch drive shaft.

6. A hold-down device, as claimed in claim 5, additionally comprising:
said knob having stop means extending inwardly which intermittently engage said drive plate for permitting said knob to rotate freely for a few decrees of rotation before said rotation is translated to said drive plate;
said ratchet member having cam surfaces extending outwardly therefrom; and
said knob having lug means extending inwardly which engage said cam surfaces on said ratchet member for disengaging said ratchet teeth of said ratchet member from said ratchet teeth of said hook connector when said knob is rotated in a loosening direction to defeat said self-locking of said hold-down device.

7. A hold-down device as claimed in claim 1, additionally comprising:
an extractor mounted upon said clutch drive shaft beyond said hook connector for engaging said hook as said hold-down device is loosened.

8. A hold-down device, as claimed in claim 1, wherein:
separation between said hook connector and said knob in a loosened condition exposes an indicator band to indicate an unloaded condition of said hold-down device.

9. A hold-down device, having a clevis bolt pivotally attached to a rack, for retaining an equipment chassis within the rack with a hook attached to the chassis, comprising:

a clutch drive shaft having a clutch plate extending therefrom threadably attached to said clevis bolt;
a clutch drive disc engaging said clutch plate;
a ratchet member slidably mounted upon said clutch drive disc having a plurality of ratchet teeth;
a hook connector mounted upon said clutch drive shaft for engaging said hook; said hook connector having a plurality of ratchet teeth engaging said ratchet teeth of said ratchet member;
a knob for rotating said clutch drive shaft upon said clevis bolt via said clutch drive disc and said clutch plate;
said clevis bolt being free of flats and grooves to accommodate said clutch arrangement.

10. A hold-down device, having a clevis bolt pivotally attached to a rack, for retaining an equipment chassis within the rack with a hook attached to the chassis, comprising:
a hook connector with means for positively locking said hook connector to said hook, said hook connector having a plurality of ratchet teeth;
a ratchet member having a plurality of ratchet teeth which engage said ratchet teeth of said hook connector for positively locking said ratchet member to said hook connector, said ratchet member having a clutch drive disc;
a clutch drive shaft having a clutch plate engaging said clutch drive disc of said ratchet member for positively locking said clutch drive shaft to said ratchet member, said clutch drive shaft engaging said clevis bolt, whereby said hold-down device comprising said hook connector, said ratchet member and said clutch drive shaft is positively locked upon said clevis bolt, said clevis bolt being free of flats and grooves normally required for such positive locking.

11. A hold-down device, as claimed in claim 10, wherein said ratchet member additionally comprises:
ratchet cam having said ratchet teeth and an aperture therein; and
said clutch drive disc is slidably received in said ratchet cam aperture and restrained from rotation therein.

12. A hold-down device, as claimed in claim 11, additionally comprising:
a knob having lug means extending inwardly therefrom mounted over said ratchet cam, wherein rotation of said knob in one direction tightens said hold-down device into said positive locking position and rotation of said knob in the other direction causes said lug means to engage said ratchet cam and separate said ratchet teeth on said ratchet cam from said ratchet teeth on said hook connector to release said positive locking therebetween and within said hold-down device.

13. A hold-down device, as claimed in claim 10, additionally comprising:
spring means for normally urging said clutch drive disc and said clutch plate into said engagement.

14. A hold-down device, as claimed in claim 10, additionally comprising:
spring means for normally urging said ratchet teeth on said ratchet member away from said ratchet teeth on said hook connector until said normal urging is overcome by the tightening of said hold-down device.

* * * * *